United States Patent [19]
Ienaga

[11] Patent Number: 5,802,002
[45] Date of Patent: Sep. 1, 1998

[54] CACHE MEMORY DEVICE OF DRAM CONFIGURATION WITHOUT REFRESH FUNCTION

[75] Inventor: Takashi Ienaga, Tokyo, Japan

[73] Assignee: NEC Corporation, Tokyo, Japan

[21] Appl. No.: 784,374

[22] Filed: Jan. 17, 1997

[30] Foreign Application Priority Data

Jan. 17, 1996 [JP] Japan ................. 8-005898

[51] Int. Cl.[6] .................... G11C 7/02; G11C 7/00
[52] U.S. Cl. .................... 365/207; 365/210; 365/222
[58] Field of Search .................. 365/189.01, 207, 365/210, 222, 230.03

[56] References Cited

U.S. PATENT DOCUMENTS 5,421,000 5/1995 Fortino et al. ............ 365/189.01
5,577,223 11/1996 Tanoi et al. ............. 365/230.03

OTHER PUBLICATIONS

Cortadella et al., "Dynamic RAM For On-Chip Instruction Caches", *Computer Architecture News*, vol. 16(4): 45–50, (1988), no month.

*Primary Examiner*—David C. Nelms
*Assistant Examiner*—Trong Phan
*Attorney, Agent, or Firm*—Foley & Lardner

[57] ABSTRACT

In a cache memory device including a DRAM cell array, a DRAM cell circuit is connected to word lines. A sense amplifier and a write amplifier are provided to the DRAM cell circuit for writing a certain data signal into one of memory cells connected to a selected word line. A read amplifier as well as the sense amplifier is provided to read data from one of the memory cells to generate a validity signal for showing whether data of the DRAM cell array is valid or invalid.

14 Claims, 8 Drawing Sheets

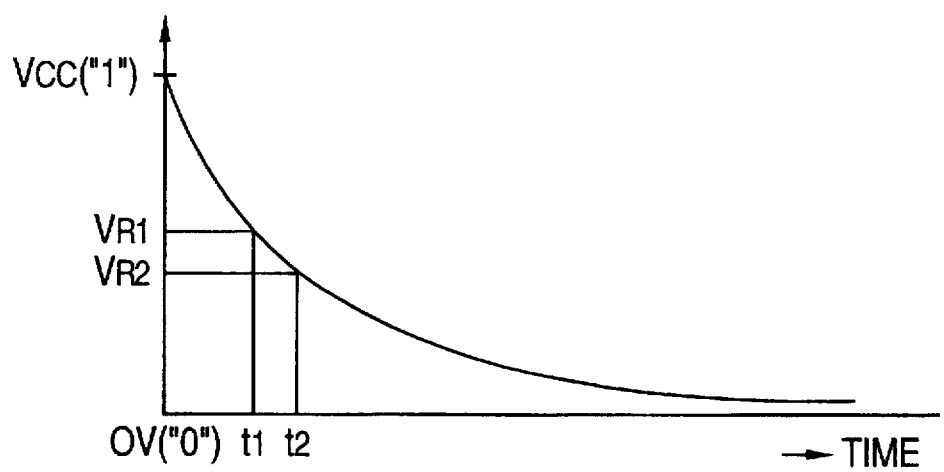
FIG. 5
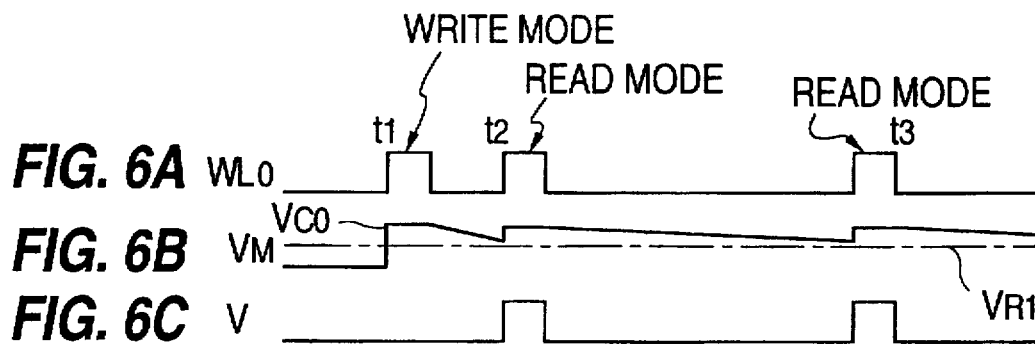

CACHE MEMORY DEVICE OF DRAM CONFIGURATION WITHOUT REFRESH FUNCTION

BACKGROUND OF THE INVENTION

1. Field of the Invention

The present invention relates to a cache memory device of a dynamic random access memory (DRAM) configuration.

2. Description of the Related Art

Generally, DRAM devices require refresh operations in order to prevent data from being decayed. Therefore, in a cache memory device adopting a DRAM configuration, a function for refresh operations has to be incorporated thereinto, which increases the device in size, thus reducing the manufacturing yield.

In one approach that has been adopted to realize a cache memory device of a DRAM configuration without refresh functions (see: Jordi Cortadella et al., "Dynamic RAM for On-chip Instruction Caches", Association for Computing Machinery, Computer Architecture News, Vol. 16, No. 4, pp. 45–50, September 1988), use is made of the fact that the refresh cycle of the conventional cache memories is about 10 to 60 ms, while the operating cycle of the conventional microprocessors is about 10 to 30 ns. This will be explained later in detail.

In this prior art cache memory device, however, the device is still large in size, thus reducing the manufacturing yield. Also, the performance of the device as a cache memory is degraded.

SUMMARY OF THE INVENTION

It is an object of the present invention to provide a cache memory device of a DRAM configuration which can increase the manufacturing yield and improve the performance thereof.

According to the present invention, in a cache memory device including a DRAM cell array, a DRAM cell circuit is connected to word lines. A sense amplifier and a write amplifier are provided for the DRAM cell circuit for writing a certain data signal into one of memory cells connected to a selected word line. A read amplifier as well as the sense amplifier is provided to read data from one of the memory cells to generate a validity signal for showing whether data of the DRAM cell array is valid or invalid.

BRIEF DESCRIPTION OF THE DRAWINGS

The present invention will be more clearly understood from the description as set forth below, as compared with the prior art, with reference to the accompanying drawings, wherein:

FIG. 5 is a graph explaining the reference voltages of FIG. 4;

FIGS. 6A, 6B and 6C are timing diagrams showing the operation of the device of FIG. 4;

DESCRIPTION OF THE PREFERRED EMBODIMENTS

Before the description of the preferred embodiments, a prior art cache memory device of a DRAM configuration will be explained with reference to FIGS. 1, 2 and 3A through 3I.

Figure 1:
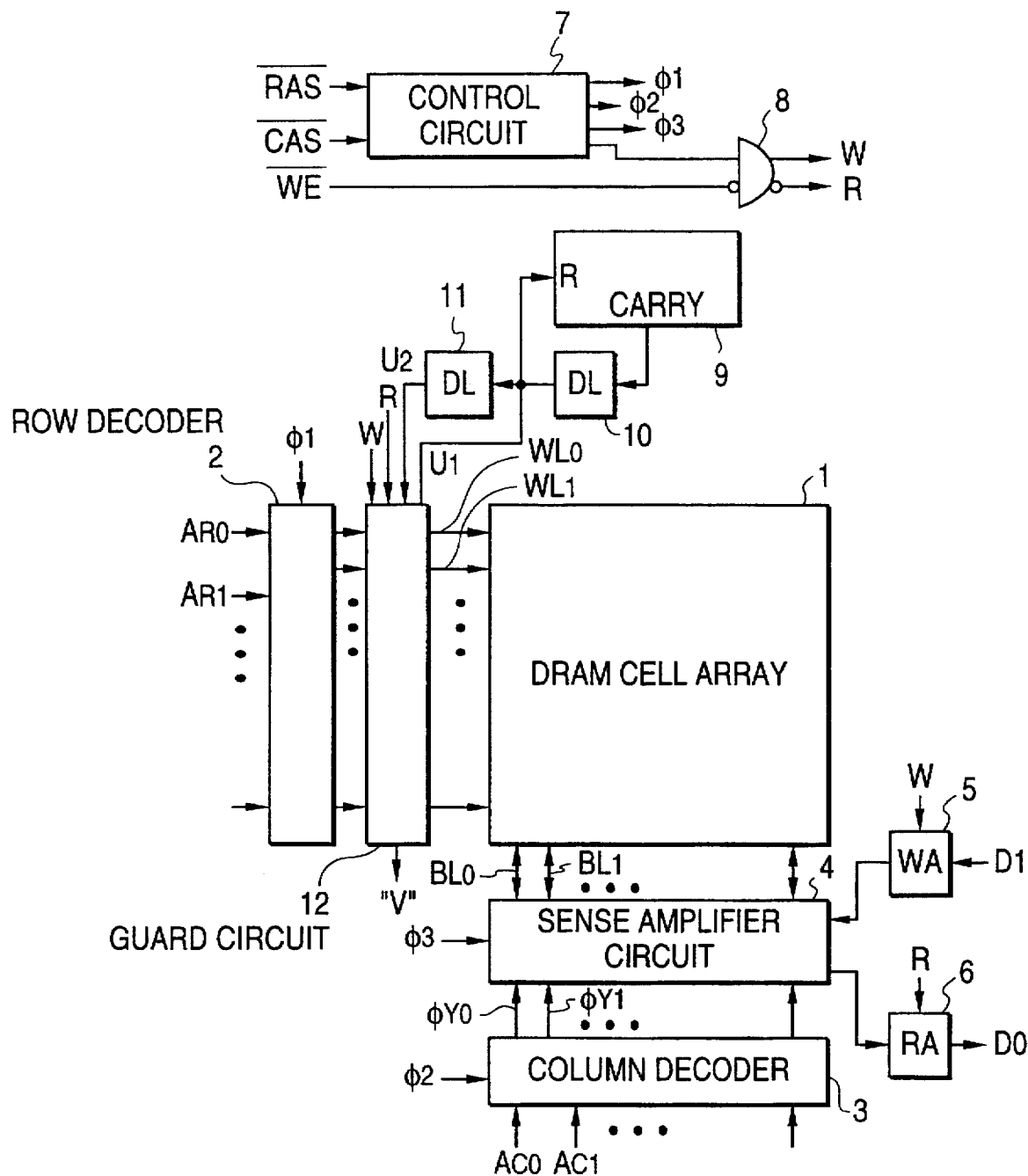
FIG. 1 is a block circuit diagram illustrating a prior art cade memory device of a DRAM configuration.

In FIG. 1, which is a block circuit diagram illustrating a prior art cache memory device of a DRAM configuration, reference numeral 1 designates a DRAM cell array having memory cells of a one-transistor, one-capacitor type at intersections between word lines $WL_0$, $WL_1$, ... and bit lines $BL_0$, $BL_1$, ....

One of the word lines $WL_0$, $WL_1$, ... is selected by a row decoder 2 which receives row address signals $A_R{}^0$, $A_R{}^1$, .... On the other hand, one of the bit lines $BL_0$, $BL_1$, ... is selected by a column decoder 3 which receives column address signals $A_c{}^0$, $A_c{}^1$, ....

Also, connected between the bit lines $BL_0$, $BL_1$, ... and the column decoder 3 is a sense amplifier circuit 4. Note that the sense amplifier circuit 4 is comprised of a plurality of sense amplifiers each connected to one of the bit lines and a plurality of column switching circuits each connected between one of the bit lines and input/output lines. The input/output lines are connected to a write amplifier 5 and a read amplifier 6.

The row decoder 2, the column decoder 3 and the sense amplifier circuit 4 are controlled by a control circuit 7 for receiving an inverted signal of a row address strobe signal RAS and an inverted signal of a column address strobe signal CAS. Also, the write amplifier 5 and the read amplifier 6 are controlled by a gate circuit 8 which receives an inverted signal of a write enable signal WE and a control signal from the control circuit 7.

No periodic refresh operation is performed upon the DRAM cell array 1. Therefore, it is required to determine whether read data DO of the read amplifier 6 is valid or invalid. For this purpose, a counter circuit 9, two delay circuits 10 and 11, and a guard circuit 12 for generating a validity signal V are provided (see: Jordi Cortadella et al., "Dynamic RAM for On-chip Instruction Caches", Association for Computing Machinery, Computer Architecture News, Vol. 16, No. 4, pp. 45–50, September 1988). That is, the counter circuit 9 generates a carry signal having a period smaller than an expected refresh cycle of the DRAM cell array 1. The delay circuit 10 delays the carry signal of the counter circuit 9 to generate a signal $U_1$, and the delay circuit 11 delays the signal $U_1$ to generate a signal $U_2$. Also, the counter circuit 9 is reset by the signal $U_1$. Further, the signals $U_1$ and $U_2$ as well as a write signal W and a read signal R of the gate circuit 8 are supplied to the guard circuit 12.

Figure 2:
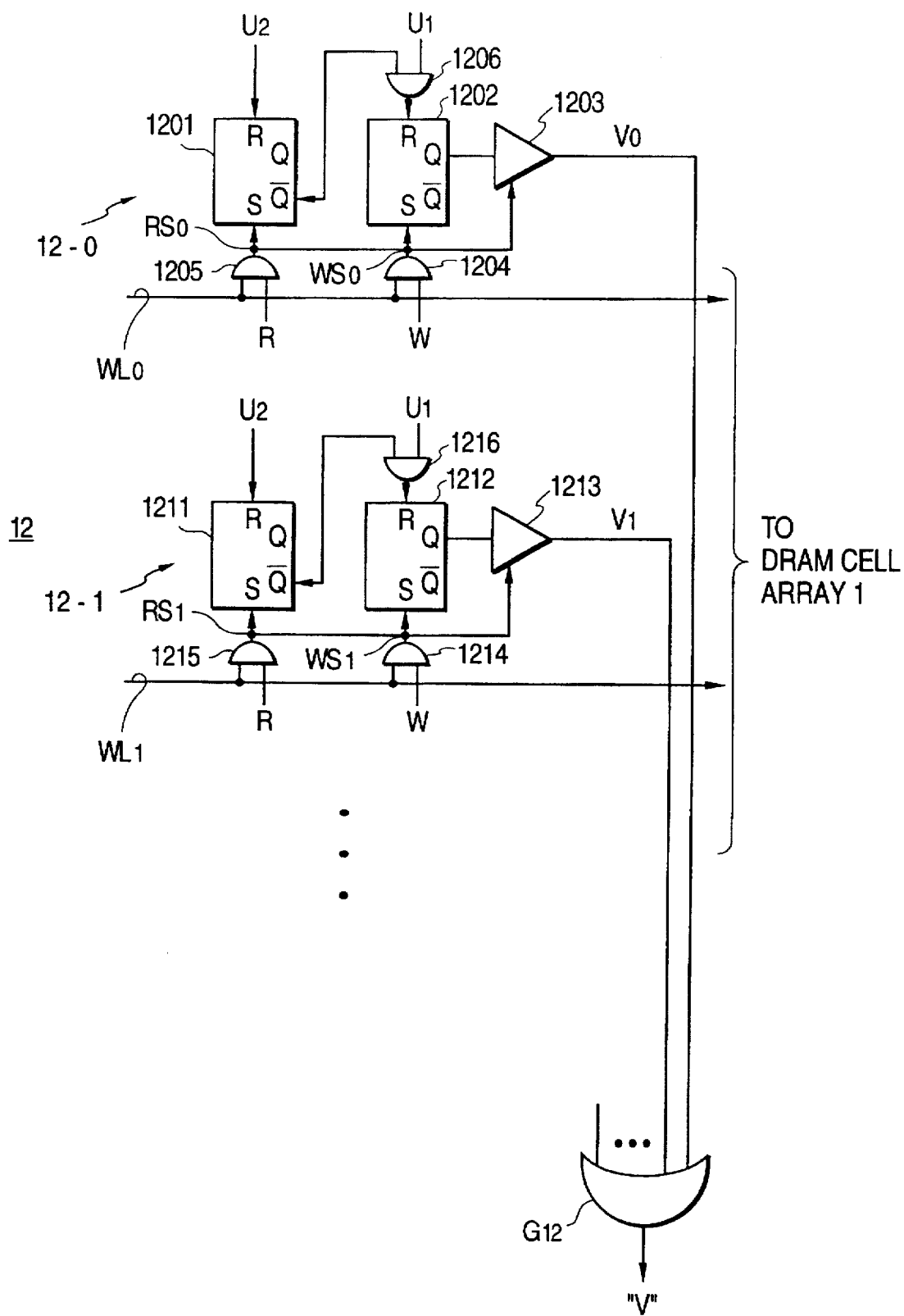
FIG. 2 is a circuit diagram of the guard circuit of FIG. 1.

In FIG. 2, which is a detailed circuit diagram of the guard circuit 12 of FIG. 1, the guard circuit 12 includes a plurality of row guard circuits 12-0, 12-1, ... each connected to one of the word lines $WL_0$, $WL_1$, ..., and an OR circuit $G_{12}$ for generating the validity signal V.

The row guard circuit such as 12-0 is formed by latch circuits 1201 and 1202, and a tri-state buffer 1203. Also, an AND circuit 1204 is provided to receive a signal at the word line $WL_0$ and the write signal W, in order to generate a write selection signal $WS_0$ for showing a selection of the word line $WL_0$ for a write mode. Further, an AND circuit 1205 is provided to receive the signal at the word line $WL_0$ and the read signal R, in order to generate a read selection signal $RS_0$ for showing a selection of the word line $WL_0$ for a read mode. Moreover, an AND circuit 1206 is provided to receive the inverted output of the latch circuit 1201 and the signal $U_1$ to reset the latch circuit 1202.

The operation of the device of FIG. 1, particularly, the operation of the guard circuit 12 of FIG. 2, is explained next with reference to FIG. 3A through 3I.

Figure 3:
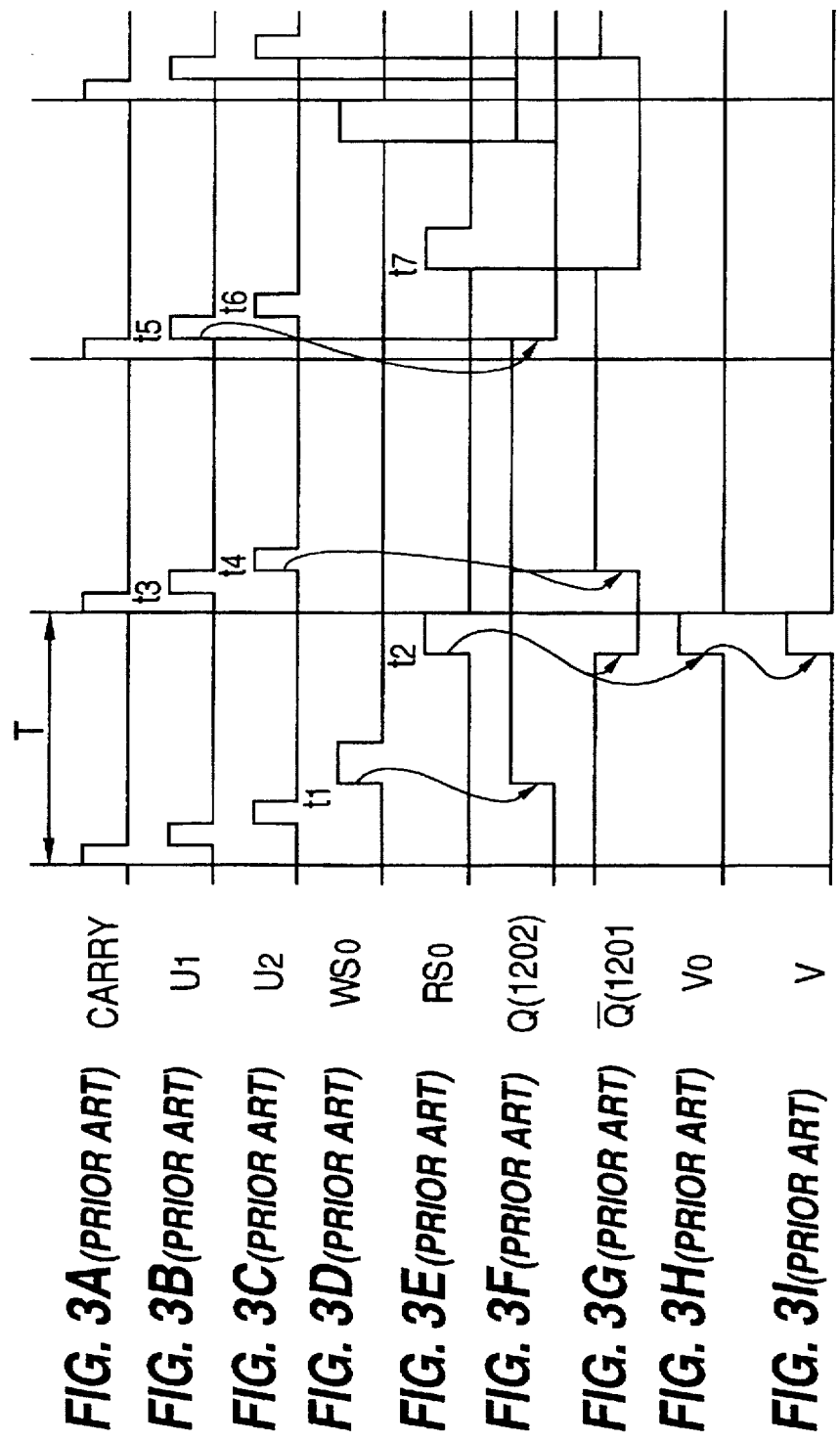
FIGS. 3A through 3I are timing diagram showing operation o the device of FIG. 1.

As shown in FIGS. 3A, 3B and 3C, the carry signal of the counter circuit 9, and the signals $U_1$ and $U_2$ are changed periodically. In this case, the period T is smaller than a half of an expected refresh cycle of the DRAM cell array 1.

In an initial state, at time t1, a microprocessor (not shown) performs an operation of writing data from a main storage unit (not shown) to the DRAM cell array 1. In this case, the write signal W is made high and the read signal R is made low. Therefore, for example, the word line $WL_0$ is selected by the row decoder 2, so that the write selection signal $WS_0$ is caused to be high as shown in FIG. 3D. As a result, as shown in FIG. 3F, the output Q of the latch circuit 1202 is changed from low to high. In addition, when the bit line $BL_0$ is selected by the column decoder 3, input data DI is written into the memory cell $MC_{00}$ (not shown) while rewriting operations or refresh operations are performed upon the other memory cells connected to the word line $WL_0$.

Next, at time t2 before the rising of the signal $U_1$ at time t3, the microprocessor performs an operation of reading data from the DRAM cell array 1. In this case, the write signal W is made low and the read signal R is made high. Therefore, for example, the word line $WL_0$ is selected by the row decoder 2, so that the read selection signal $RS_0$ is caused to be high as shown in FIG. 3E. As a result, as shown in FIG. 3G, the output $\overline{Q}$ of the latch circuit 1201 is changed from high to low. Also, simultaneously, as shown in FIG. 3H, the tri-state buffer 1203 is activated so that the validity signal $V_0$ is made the same as the output Q of the latch circuit 1202, i.e., the validity signal $V_0$ becomes high as shown in FIG. 3H. In addition, when the bit line $BL_0$ is selected by the column decoder 3, data is read out of the memory cell $MC_{00}$ (not shown) to the read buffer 6 while rewriting operations or refresh operations are performed upon all of the memory cells connected to the word line $WL_0$.

When the validity signal $V_0$ is changed from low to high, the validity signal V is also changed from low to high as shown in FIG. 3I.

Therefore, the microprocessor uses the validity signal V of the guard circuit 12 so as to determine whether the device is hit or miss-hit.

Next, at time t3, as shown in FIG. 3B, the signal $U_1$ is changed from low to high. In this case, however, since the output $\overline{Q}$ of the latch circuit 1201 is low as shown in FIG. 3G, the state of the latch circuit 1202 is unchanged as shown in FIG. 3F.

Next, at time t4, when the signal $U_2$ is changed from low to high as shown in FIG. 3C, the latch circuit 1201 is reset as shown in FIG. 3G.

Next, at time t5, as shown in FIG. 3B, the signal $U_1$ is again changed from low to high. In this case, since the output Q of the latch circuit 1201 is high as shown in FIG. 3G, the latch circuit 1202 is reset as shown in FIG. 3F.

Next, at time t6, even when the signal $U_2$ is again changed from low to high as shown in FIG. 3C, the state of the latch circuit 1201 is unchanged.

Next, at time t7, the microprocessor performs a operation of reading data from the DRAM cell array 1. Even in this case, the write signal W is made low and the read signal R is made high. Therefore, for example, the word line $WL_0$ is selected by the row decoder 2, so that the read selection signal $RS_0$ is caused to be high as shown in FIG. 3E. As a result, as shown in FIG. 3G, the output $\overline{Q}$ of the latch circuit 1201 is changed from high to low. Also, simultaneously, as shown in FIG. 3H, the tri-state buffer 1203 is activated so that the validity signal $V_0$ is made the same as the output Q of the latch circuit 1202, i.e., the validity signal $V_0$ is low as shown in FIG. 3H. Therefore, the validity signal V is also low as shown in FIG. 3I.

Therefore, the microprocessor invalidates read data DO of the read buffer 6, and as a result, the microprocessor reads data from the main storage unit to restore the data in the device of FIG. 1.

Since the validity signal V showing the output of the latch circuit such as 1202 is reset within the period T which is smaller than half of the expected refresh cycle of the DRAM cell array 1, the high level state of the memory cells of the DRAM cell array 1 connected to the selected word line can be guaranteed within the period T.

Also, when a read operation is performed upon the memory cells connected to the selected word line before the rising of the signal $U_1$, the latch circuit 1201 is set to prevent the latch circuit 1202 from being reset by the signal $U_1$. Therefore, the set state of the latch circuit 1202 continues. In this case, since rewriting operations or refresh operations are performed upon the memory cells connected to the selected word line, the set state of the latch circuit 1202 is guaranteed for a further period T.

When no writing or reading operation is carried out, the set state of the latch circuit 1202 continues for only a maximum period 2T which is also smaller than the expected refresh cycle of the DRAM cell array 1. Therefore, the validity of data of the memory cells connected to the selected word line can be maintained.

Thus, when the microprocessor reads data from the cache memory device of FIG. 1, the microprocessor knows whether the data is valid or invalid in accordance with the validity signal V of the guard circuit 12. Note that the refresh cycle of the conventional cache memories is about 10 to 60 ms, while the operating cycle of conventional microprocessors is about 10 to 30 ns. Therefore, the device of FIG. 1 having a function for generating the validity signal V can be sufficiently used as a cache memory.

In the cache memory device of FIG. 1, however, the presence of the counter circuit 9, the delay circuits 10 and 11, and the guard circuit 12 increases the device in size, thus reducing the manufacturing yield. Also, since the timing of a writing operation affects the period of the validity signal V, the period of the validity signal V may be shortened, so as to increase the number of rewriting operations from the main storage unit to the device of FIG. 1. That is, the performance of the device of FIG. 1 as a cache memory is degraded.

Figure 4:
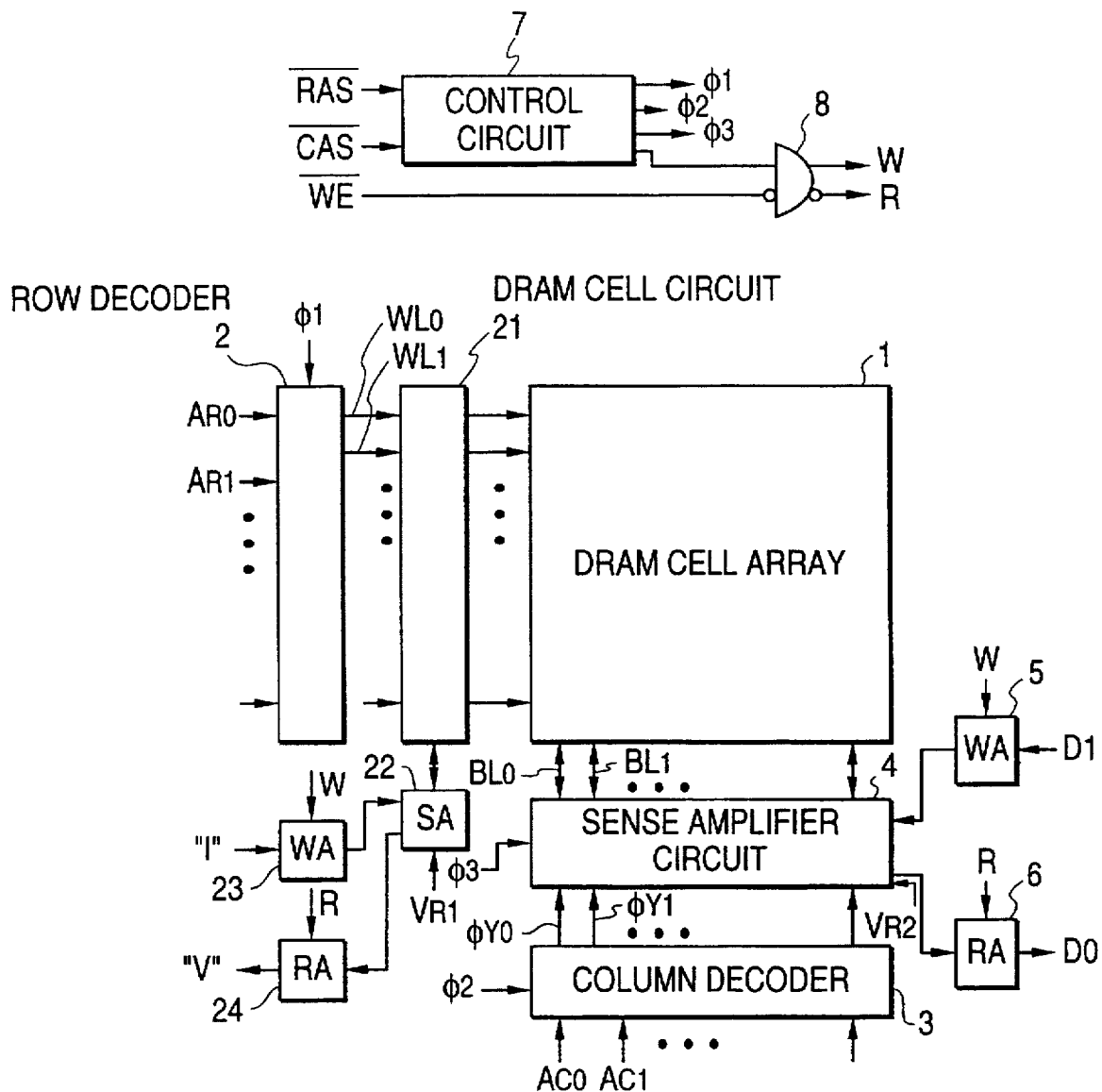
FIG. 4 is a block circuit diagram illustrating a first embodiment of the cache memory device of a DRAM configuration according to the present invention.

In FIG. 4, which illustrates a first embodiment of the present invention, a DRAM cell circuit 21, a sense amplifier 22, a write amplifier 23 and a read amplifier 24 are provided instead of the counter circuit 9, the delay circuits 10 and 11, and the guard circuit 12 of FIG. 1, thus reducing the device in size.

The write amplifier 23 always receives data "1" or a high level signal. Also, the read amplifier 24 generates a validity signal V for showing that read data is valid.

Further, a reference voltage $V_{R^1}$ supplied to the sense amplifier 22 is higher than a reference voltage $V_{R^2}$ supplied to the sense amplifier circuit 4. Note that, if the voltage at a memory cell immediately after a writing operation of data "1" is $V_{cc}$, and the voltage at the memory cell after a writing operation of data "0" is 0V, the following condition is satisfied (see FIG. 5):

$$0V < V_{R^2} < V_{R^1} < V_{cc}$$

That is, as shown in FIG. 5, in a DRAM cell, when data "1" is written thereinto, the voltage $V_M$ at the cell capacitor becomes $V_{CC}$. However, if no refresh operation is performed upon this DRAM cell, this voltage $V_M$ is gradually reduced over time. In this case, at time t1, the voltage $V_M$ reaches $V_{R^1}$, and thereafter, at time t2, the voltage $V_M$ reaches $V_{R^2}$.

The operation of the device of FIG. 4 is explained next with reference to FIG. 6A through 6C.

In an initial state, at time t1, a microprocessor (not shown) performs an operation of writing data from a main storage unit (not shown) to the DRAM cell array 1. In this case, the write signal W is made high and the read signal R is made low. Therefore, for example, the word line $WL_0$ is selected by the row decoder 2, so that the voltage of the word line $WL_0$ is caused to be high as shown in FIG. 6A. In addition, when the bit line $BL_0$ is selected by the column decoder 3, input data DI is written into the memory cell $MC_{00}$ while rewriting operations or refresh operations are performed upon the other memory cells connected to the word line $WL_0$. Simultaneously, data "1" is written from the write amplifier 23 into a memory cell of the DRAM cell circuit 21 connected to the word line $WL_0$. As a result, as shown in FIG. 6B, the voltage $V_M$ of the selected memory cell of the DRAM cell circuit 21 is increased at $V_{CC}$.

Next, at time t2, the microprocessor performs a operation of reading data from the DRAM cell array 1. In this case, the write signal W is made low and the read signal R is made high. Therefore, For example, when the word line $WL_0$ is selected by the row decoder 2, and the bit line $BL_0$ is selected by the circuit decoder 3, data is read out of the memory cell $MC_{00}$ (not shown) to the read amplifier 6 while rewriting operations or refresh operations are performed upon all of the memory cells connected to the word line $WL_0$.

Simultaneously, the data is read out of the memory cell of the DRAM cell circuit 21 connected to the word line $WL_0$. In this case, since the voltage $V_M$ at the cell capacitor of the selected memory cell is higher than $V_{R^1}$, the read amplifier 24 generates the validity signal V as shown in FIG. 6C. Also, a rewriting or refresh operation is performed upon this memory cell, so that the voltage $V_M$ again recovers to $V_{CC}$.

Next, at time t3, the microprocessor again performs an operation of reading data from the DRAM cell array 1. In this case, the write signal W is made low and the read signal R is made high. Therefore, for example, when the word line $WL_0$ is selected by the row decoder 2, and the bit line $BL_0$ is selected by the circuit decoder 3, data is read out of the memory cell $MC_{00}$ (not shown) to the read amplifier 6 while rewriting operations or refresh operations are performed upon all of the memory cells connected to the word line $WL_0$.

Simultaneously, the data is read out of the memory cell of the DRAM cell circuit 21 connected to the word line $WL_0$. Also, in this case, since the voltage $V_M$ at the cell capacitor of the selected memory cell is higher than $V_{R^1}$, the read amplifier 24 generates the validity signal V as shown in FIG. 6C. Also, a rewriting or refresh operation is performed upon this memory cell, so that the voltage $V_M$ again recovers to $V_{CC}$.

In FIG. 4, when the validity signal V is "1", the high level state of the memory cells of the DRAM cell array 1 connected to the selected word line can be guaranteed.

Also, when a read operation is performed upon the memory cells connected to the selected word line before the falling of the validity signal V, rewriting operations or refresh operations are performed upon the memory cells of the DRAM cell array 1 and the DRAM cell circuit 21 connected to the selected word line, so that the state of these memory cells is guaranteed for a further period.

When no writing or reading operation is carried out, the state of the memory cells continues for only a maximum period determined by the reference voltage $V_{R^1}$. This period corresponds to the expected refresh cycle of the DRAM cell array 1. Therefore, the validity of data of the memory cells connected to the selected word line can be maintained.

Thus, when the microprocessor reads data from the cache memory device of FIG. 4, the microprocessor determines whether the data is valid or invalid in accordance with the validity signal V of the read amplifier 24.

Figure 7:
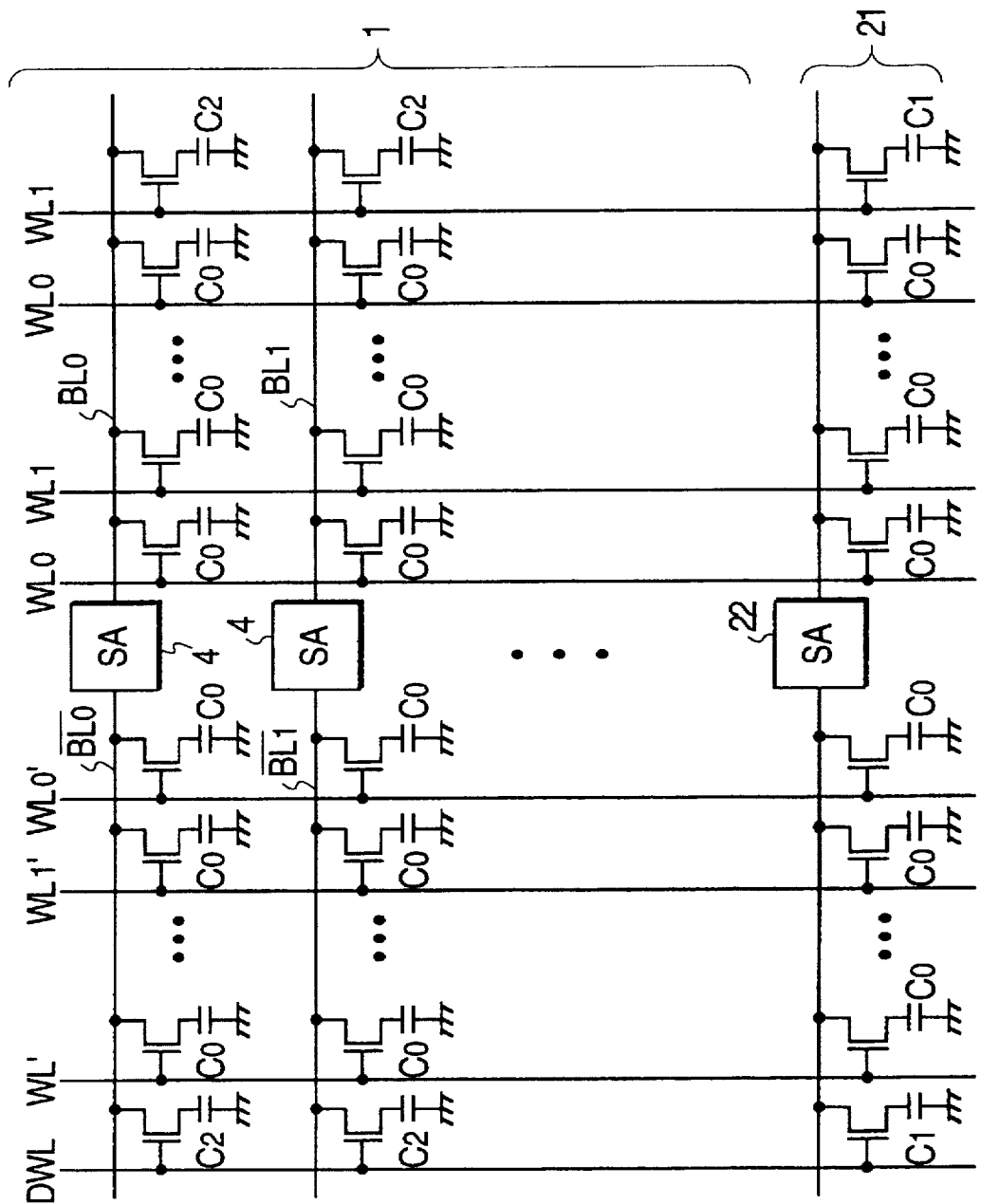
FIG. 7 is a detailed circuit diagram of the DRAM cell array and the DRAM cell column of FIG. 4.

In FIG. 4, the reference voltages $V_{R^1}$ and $V_{R^2}$ supplied to the sense amplifier circuit 4 and the sense amplifier 22 are definite. However, the reference voltages $V_{R^1}$ and $V_{R^2}$ are actually given by dummy memory cells. For example, as illustrated in FIG. 7 which illustrates an open bit line type, the voltages $V_{R^1}$ and $V_{R^2}$ are determined by cell capacitors $C_1$ and $C_2$ of dummy cells connected to dummy word lines DWL and DWL'. In this case, $$C_2 < C_1 < C_0$$

where $C_0$ is a capacitance of one of the memory cells of the dram cell array 1 and the DRAM cell circuit 21.

For example, $C_1 = 3C_0/4$ and $C_2 = C_0/2$.

Note that, when one of the word lines $WL_0, WL_1, \ldots$ (or $WL_0', WL_1', \ldots$) is selected, the dummy word line DWL (or DWL') is selected.

Figure 8:
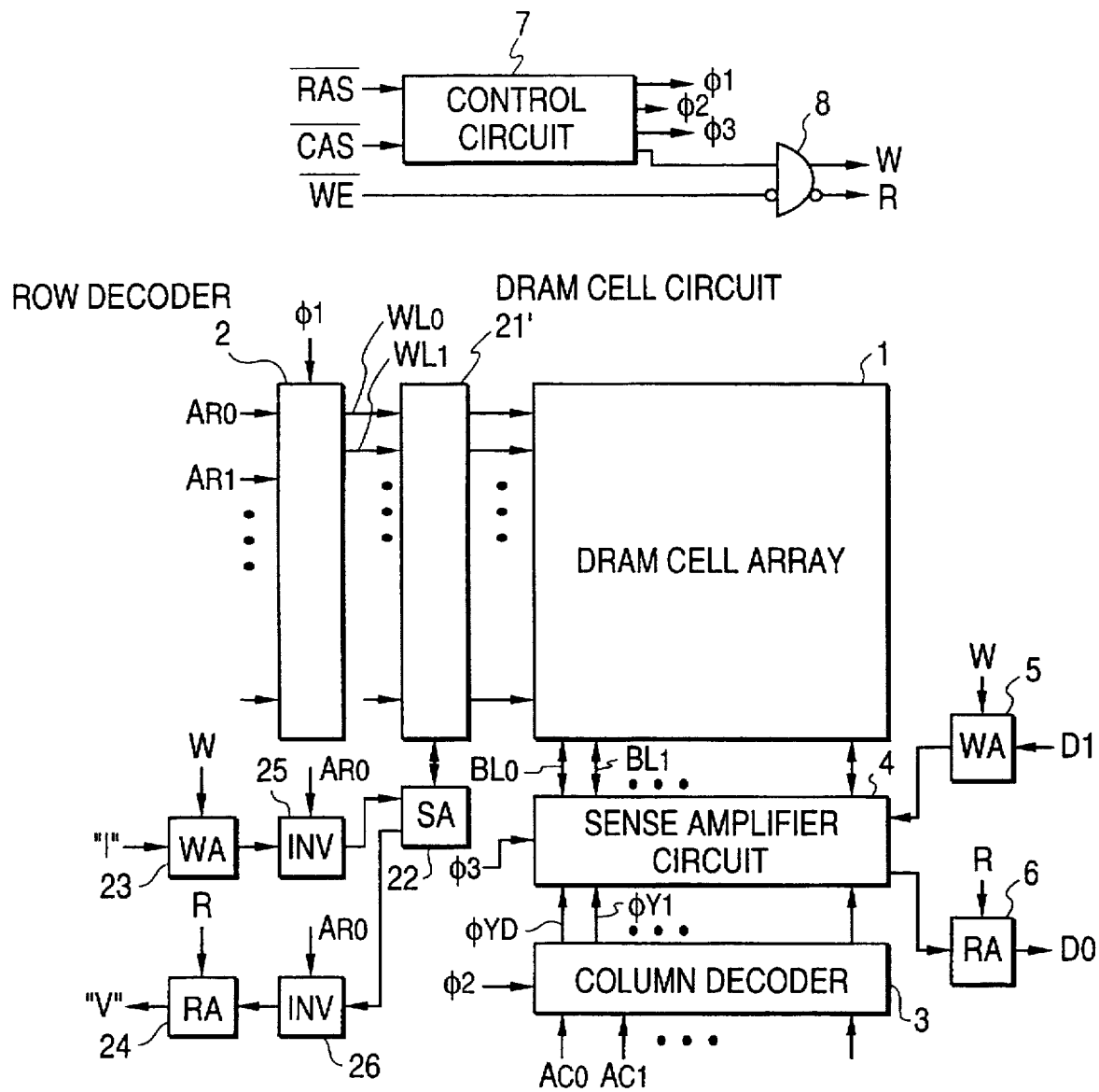
FIG. 8 is a block circuit diagram illustrating a second embodiment of the cache memory device of a DRAM configuration according to the present invention.

In FIG. 8, which illustrates a second embodiment of the present invention, the DRAM cell array 1 and the DRAM cell circuit 21 of FIG. 4 are converted into a DRAM cell array 1' and a DRAM cell circuit 21', respectively, of a folded bit line type. In this case, the dummy memory cells of FIG. 7 are not provided. Therefore, the reference voltages $V_{R^1}$ and $V_{R^2}$ are the same as each other. Even in this case, a similar effect to that of the first embodiment can be expected.

Figure 9:
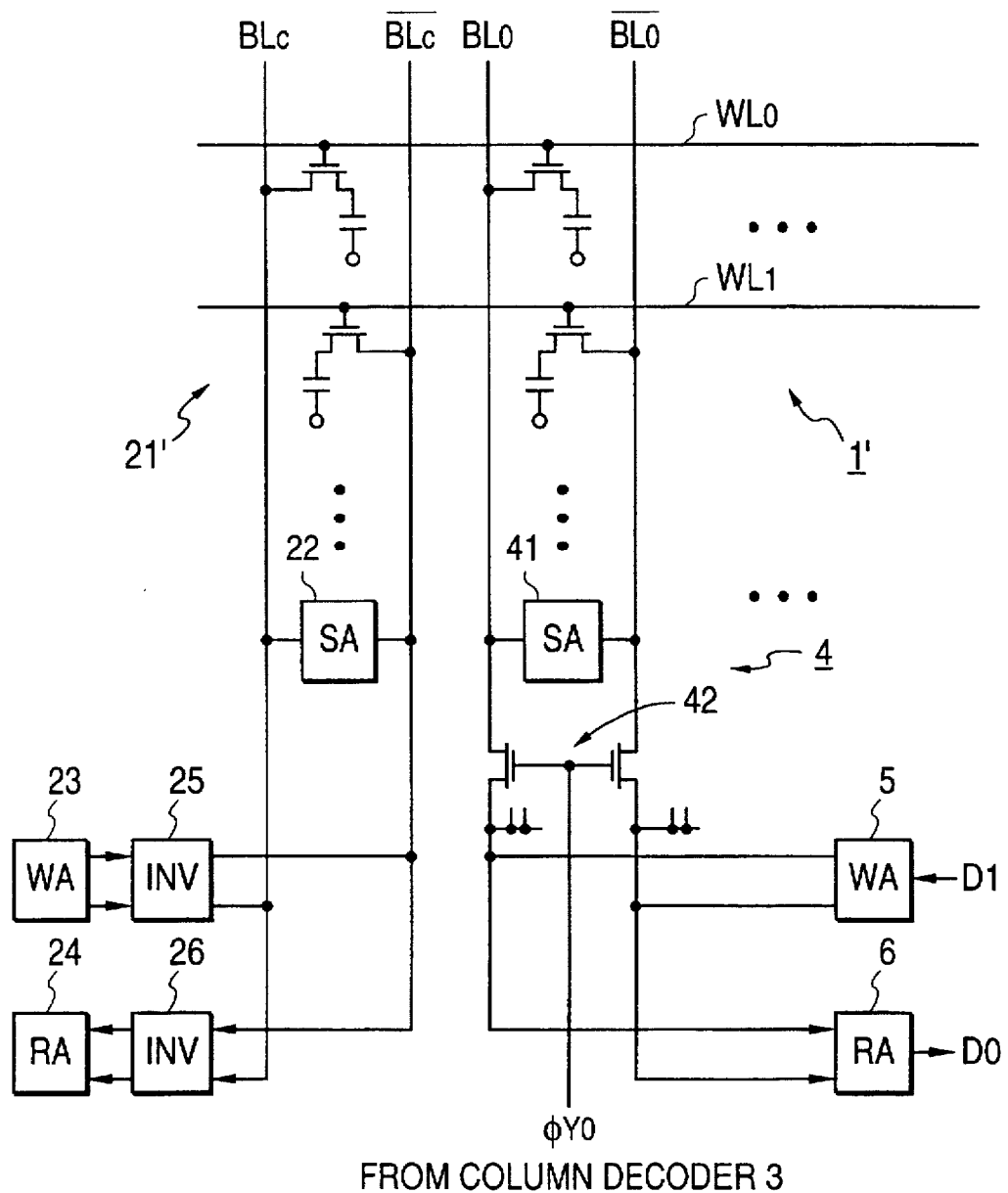
FIG. 9 is a detailed circuit diagram of the DRAM cell array and the DRAM cell column of FIG. 8.

Also, in FIG. 9, the sense amplifier circuit 4 includes a plurality of sense amplifiers 41 each connected to one pair of bit lines and a plurality of pairs of circuit switching transistors 42 controlled by the circuit decoder 3.

Further, in the DRAM cell circuit 21', memory cells connected to the word lines $WL_0, WL_2, \ldots$ are connected to a bit line $BL_c$ while memory cells connected to the word lines $WL_0, WL_2, \ldots$ are connected to a bit line $\overline{BL_c}$. Therefore, the relationship between the write amplifier 23 (the read amplifier 24) and the bit lines $BL_c$ and $\overline{BL_c}$ has to be controlled in accordance with a selected word line. For this purpose, two inverters 25 and 26, which are controlled by one bit of the address signals such as $A_{R0}$, are provided.

As explained hereinabove, according to the present invention, the device can be reduced in size to increase the manufacturing yield. Also, the performance of the device can be improved.

I claim:

1. A cache memory device comprising:
   a plurality of word lines;
   a plurality of bit lines;
   a DRAM cell array having first memory cells at intersections between said word lines and said bit lines;
   sense amplifier means, connected to said bit lines, for sensing data from said DRAM cell array;

a DRAM cell circuit having second memory cells connected to said word lines;

writing means, connected to said DRAM cell circuit, for writing a certain data signal into one of said second memory cells connected to a selected one of said word lines;

reading means, connected to said DRAM cell circuit, for reading data from one of said second memory cells connected to a selected one of said word lines to generate a validity signal for showing whether or not the data sensed by said sense amplifier means is valid or invalid.

2. The device as set forth in claim 1, wherein a reference voltage of said reading means is different from a reference voltage of said sense amplifier means.

3. The device as set forth in claim 2, wherein a voltage of said certain data signal is closer to the reference voltage of said reading means than the reference voltage of said sense amplifier means.

4. The device as set forth in claim 1, wherein said DRAM cell array and said DRAM cell circuit are of an open bit line type.

5. The device as set forth in claim 4, wherein the following condition is satisfied:

$$C_2 < C_1 < C_0$$

where $C_0$ is a capacitance of one memory capacitor of said first and second memory cells;

$C_1$ is a capacitance of one of dummy memory cells of said DRAM cell circuit; and $C_2$ is a capacitance of one of dummy memory cells of said DRAM cell array.

6. The device as set forth in claim 1, wherein said DRAM cell array and said DRAM cell circuit are of a folded bit line type.

7. The device as set forth in claim 6, wherein said writing means comprises data inverting means for inverting said certain data signal in accordance with a bit of row address signals, said reading means comprising data inverting means for inverting an output signal of said sense amplifier in accordance with the bit of said row address signals.

8. A cache memory device comprising:

a plurality of word lines;

a plurality of bit lines;

a DRAM cell array having first memory cells at intersections between said word lines and said bit lines;

sense amplifier means, connected to said bit lines, for sensing data from said DRAM cell array;

a DRAM cell circuit having second memory cells connected to said word lines;

a sense amplifier connected to said DRAM cell circuit;

a write amplifier, connected to said sense amplifier, for writing a certain data signal into one of said second memory cells connected to a selected one of said word lines;

a read amplifier, connected to said sense amplifier, for reading data from one of said second memory cells connected to a selected one of said word lines to generate a validity signal for showing whether or not the data sensed by said sense amplifier means is valid or invalid.

9. The device as set forth in claim 8, wherein a reference voltage of said sense amplifier is different from a reference voltage of said sense amplifier means.

10. The device as set forth in claim 9, wherein a voltage of said certain data signal is closer to the reference voltage of said sense amplifier than the reference voltage of said sense amplifier means.

11. The device as set forth in claim 8, wherein said DRAM cell array and said DRAM cell circuit are of an open bit line type.

12. The device as set forth in claim 11, wherein the following condition is satisfied:

$$C_2 < C_1 < C_0$$

where $C_0$ is a capacitance of one memory capacitor of said first and second memory cells;

$C_1$ is a capacitance of one of dummy memory cells of said DRAM cell circuit; and $C_2$ is a capacitance of one of dummy memory cells of said DRAM cell array.

13. The device as set forth in claim 8, wherein said DRAM cell array and said DRAM cell circuit are of a folded bit line type.

14. The device as set forth in claim 13, further comprising:

data inverting means, connected between said write amplifier and said sense amplifier, for inverting said certain data signal in accordance with a bit of row address signals; and data inverting means, connected between said sense amplifier and said read amplifier, for inverting an output signal of said sense amplifier in accordance with the bit of said row address signals.

* * * * *